US009207259B2

(12) United States Patent
Hsu

(10) Patent No.: US 9,207,259 B2
(45) Date of Patent: Dec. 8, 2015

(54) PROBE CARD FOR PROBING INTEGRATED CIRCUITS

(75) Inventor: Ming Cheng Hsu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 1138 days.

(21) Appl. No.: 13/158,214

(22) Filed: Jun. 10, 2011

(65) Prior Publication Data
US 2012/0313659 A1 Dec. 13, 2012

(51) Int. Cl.
*G01R 31/00* (2006.01)
*G01R 1/067* (2006.01)
*G01R 1/073* (2006.01)

(52) U.S. Cl.
CPC ........ *G01R 1/06772* (2013.01); *G01R 1/07314* (2013.01)

(58) Field of Classification Search
CPC ............. G01N 1/4022; G01R 1/07314; G01R 31/2889
USPC .................. 324/755.01–756.01, 500, 762.01; 439/480, 482, 578, 585; 257/E21.526, 257/E23.079, E27.105; 438/14–18, 53
See application file for complete search history.

(56) References Cited

U.S. PATENT DOCUMENTS

| 7,495,464 | B2 * | 2/2009 | Miyazaki et al. | ........ 324/756.02 |
| 7,696,766 | B2 * | 4/2010 | Cheng et al. | ............. 324/756.07 |
| 7,714,310 | B2 * | 5/2010 | Kim et al. | ................ 250/559.45 |
| 2008/0061808 | A1 * | 3/2008 | Mok et al. | ..................... 324/758 |

OTHER PUBLICATIONS

Leslie, B., et al., "Membrane Probe Card Technology," IEEE, 1988 International Test Conference, Paper 30.1, pp. 601-607.

* cited by examiner

*Primary Examiner* — Tung X Nguyen
*Assistant Examiner* — Trung Nguyen
(74) *Attorney, Agent, or Firm* — Slater & Matsil, L.L.P.

(57) ABSTRACT

An apparatus includes a metal housing, and a pogo pin penetrating through the metal housing. The pogo pin has a first end extending out of a first surface of the metal housing, and a second end extending out of a second surface of the metal housing, with the first and the second surfaces being opposite surfaces of the metal housing. A membrane is attached to the metal housing, wherein the membrane includes a metal line embedded therein. A metal pad is in physical contact with the pogo pin, wherein at least a portion of the metal pad is inside the membrane.

20 Claims, 5 Drawing Sheets

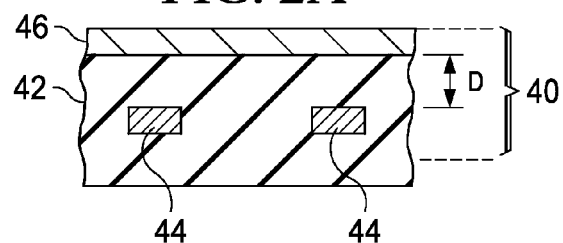
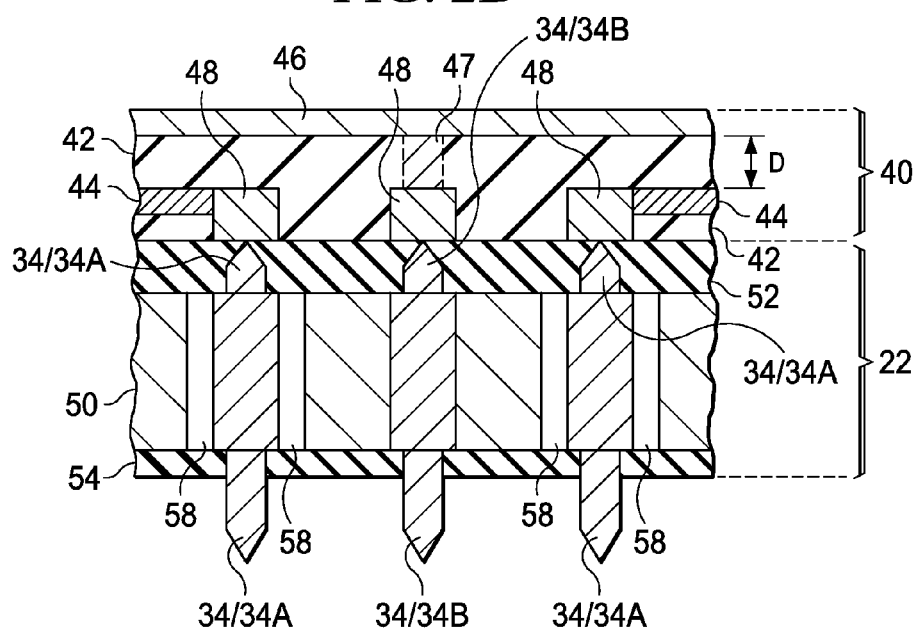

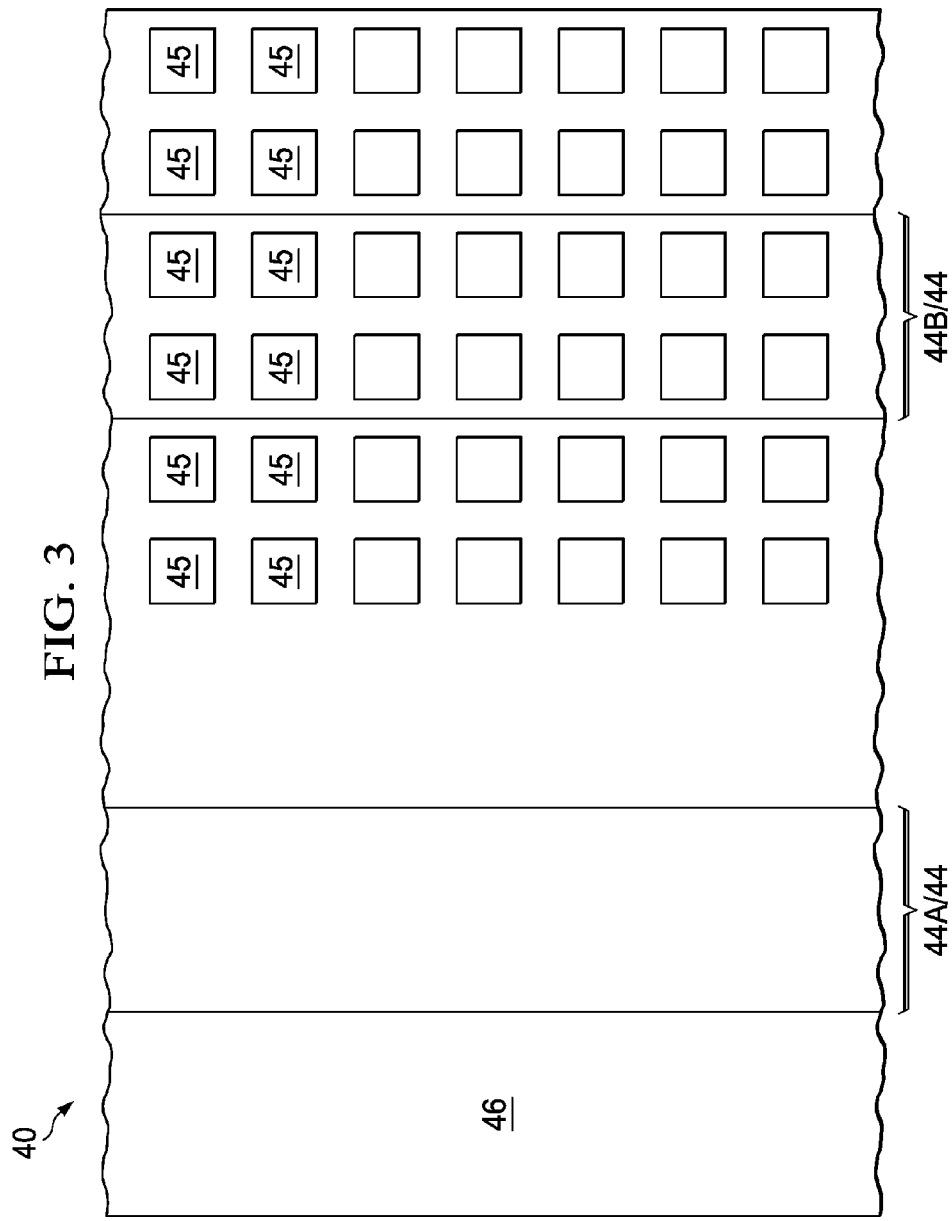

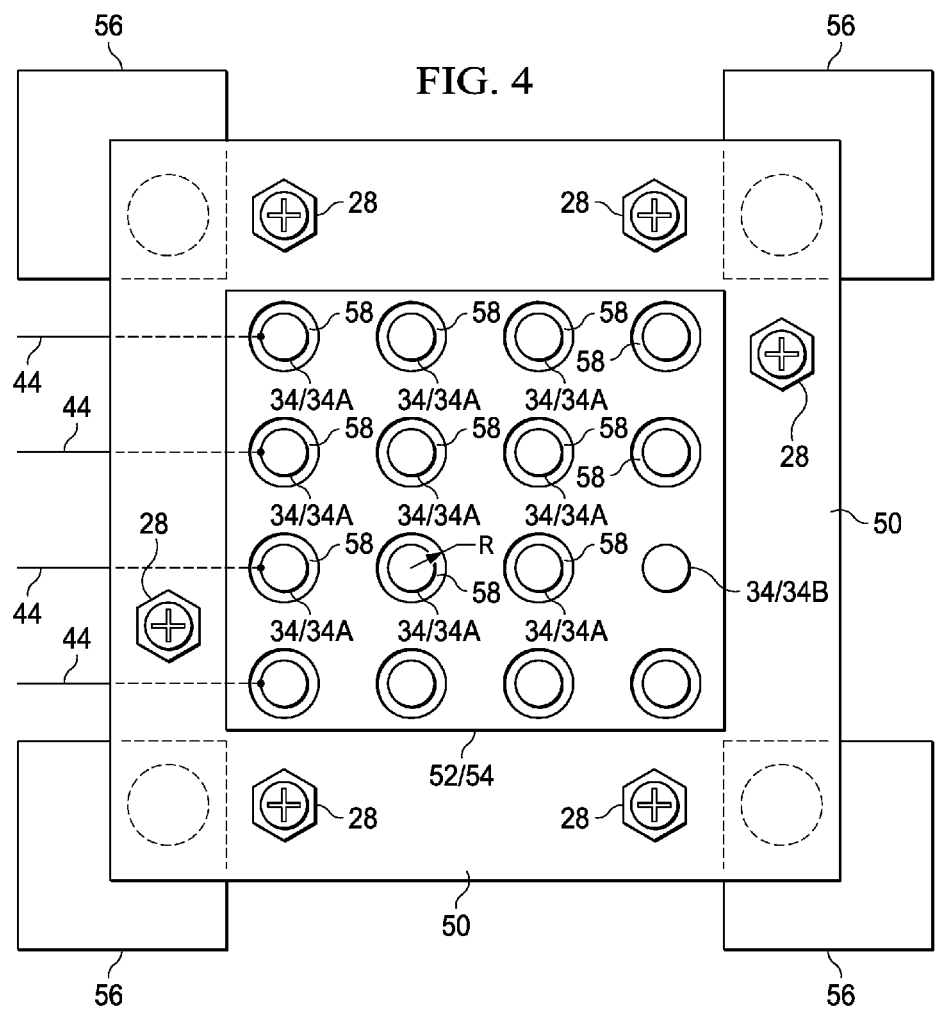

PROBE CARD FOR PROBING INTEGRATED CIRCUITS

BACKGROUND

With the evolving of semiconductor technologies, semiconductor dies are becoming increasingly smaller. However, more functions need to be integrated into the semiconductor dies. Accordingly, the semiconductor dies need to have increasingly greater numbers of I/O pads packed into smaller areas. As a result, the packaging of the semiconductor dies becomes more difficult, which adversely affects the yield.

To allow for more solder balls connected a die, fan-out wafer level chip scale package (WLCSP) was developed. In the fan-out WLCSP, dies are sawed from wafers before they are packaged onto other wafers, and only "known-good-dies" are packaged. An advantageous feature of this packaging technology is that the I/O pads on a die can be redistributed to a greater area than the die itself, and hence the number of I/O pads packed on the surfaces of the dies can be increased.

Currently, the packages are tested using probe cards, which have probe pins that may contact the contact pads (or metal bumps, solder balls, etc.) of the devices-under-test (DUTs). The testing of the fan-out WLCSPs, however, faces challenges. For example, for the testing of the packages of RF circuits, membrane probe card is the only type of probe cards that is available now. However, existing membrane probe cards require that the coplanarity of the DUTs to be smaller than about 35 µm. The fan-out WLCSPs, however, due to the large solder balls, may have coplanarity up to about 50 µm. When the membrane probe cards are used to probe the fan-out WLCSPs, good packages may be misjudged as bad package. This is caused since some of the solder balls of the DUTs may not be able to be in contact with some of the probe pins during the probing. To avoid such a problem, an excess force may be applied to press the membrane probe cards against the DUTs in order to ensure the contact between the membrane probe cards and the DUTs. This, however, may result in the expensive membrane probe cards to be damaged.

BRIEF DESCRIPTION OF THE DRAWINGS

For a more complete understanding of the embodiments, and the advantages thereof, reference is now made to the following descriptions taken in conjunction with the accompanying drawings, in which:

FIG. 2A illustrates a cross-sectional view of a portion of a membrane used in the probe card;

FIG. 2B illustrates a magnified view of a portion of the membrane and the socket;

FIG. 3 illustrates a bottom view of the membrane in the probe card shown in FIG. 1;

FIG. 4 illustrates a bottom view of a metal housing and grounding bars in the probe card shown in FIG. 1.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A probe card that has a high tolerance to coplanarity is provided in accordance with an embodiment. The variations and the operation of the embodiment are discussed. Throughout the various views and illustrative embodiments, like reference numbers are used to designate like elements.

Figure 1:
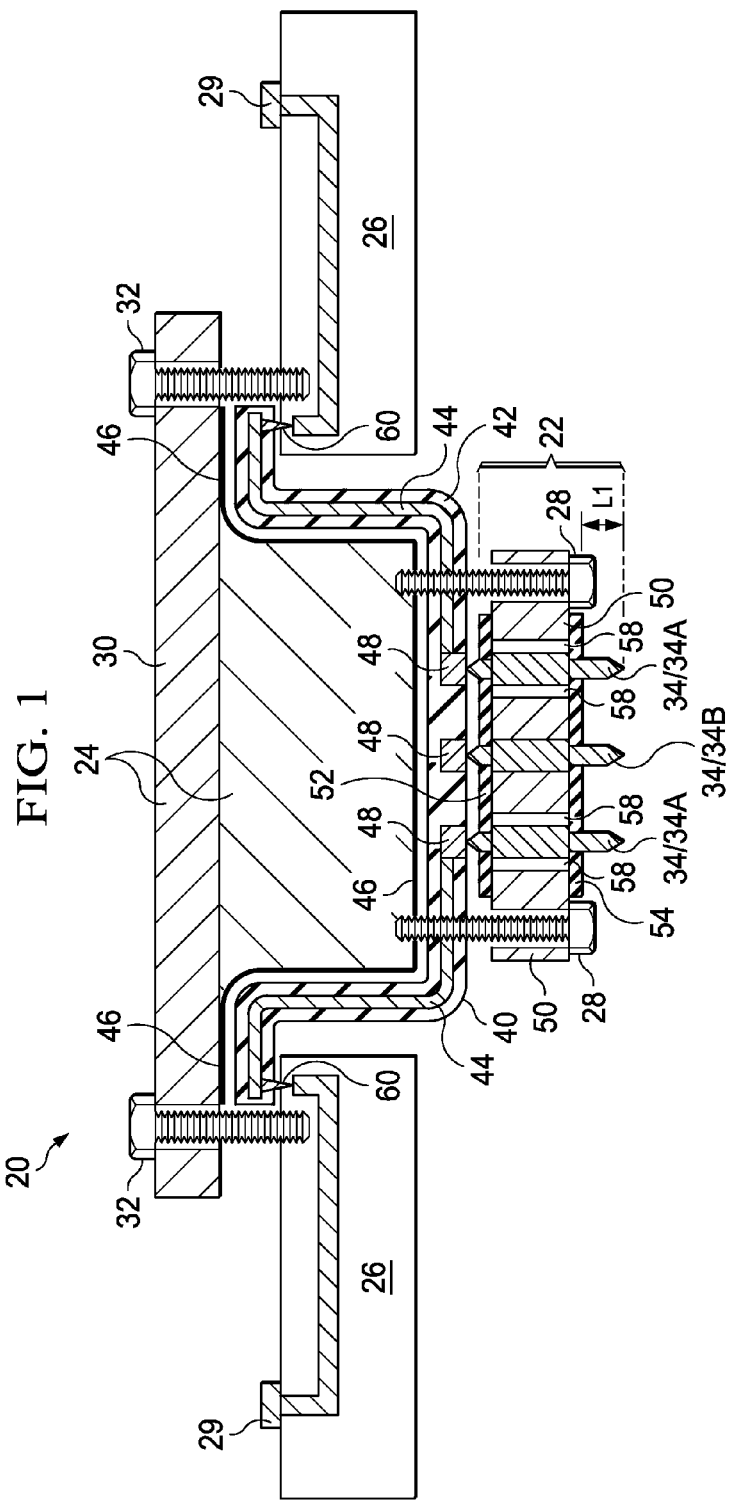
FIG. 1 illustrates a cross-sectional view of a probe card in accordance with an embodiment.

FIG. 1 illustrates a cross-sectional view of probe card 20 in accordance with an embodiment. Probe card 20 includes socket 22, fixture 24, and printed circuit board (PCB) 26. Socket 22 is attached onto fixture 24. In an embodiment, Socket 22 is secured on fixture 24 through screws 28, although other mechanisms such as clamps may also be used. Fixture 24 may further be secured on PCB 26, for example, by screwing gold frame 30 (using screws 32) of fixture 24 onto PCB 26.

Socket 22 includes pogo pins 34 (including signal pins 34A and ground pin(s) 34B) that are used for probing device-under-test (DUT, not shown). In addition, pogo pins 34 may include power pins, which may have the same structure as signal pins 34A or ground pin 34B. Pogo pins 34 are electrically coupled to metal pads/bumps 29 on PCB 26, and metal pads/bumps 29 may further be connected to a tester (not shown). The electrical connection between pogo pins 34 and PCB 26 is achieved through membrane 40. FIGS. 2A and 2B illustrate cross-sectional views of Membrane 40. As shown in FIGS. 1, 2A, and 2B, membrane 40 includes metal lines 44 for electrically interconnecting pogo pins 34 and PCB 26, dielectric layer(s) 42 for isolating metal lines 44, and metal mesh 46 for electrical grounding. Membrane 40 is flexible, and may be bended to fit the contour of fixture 24 and PCB 26. Membrane 40 may be adhered onto fixture 24, for example, through an adhesive (not shown). Furthermore, screws 28 also have the function of securing membrane 40 onto fixture 24, for example, by pressing socket 22 against fixture 24, which causes membrane 40 to be pressed against fixture 24.

Fixture 24 may be a metal frame formed of a metallic material such as aluminum, although other materials such as dielectric materials may also be used. Fixture 24 includes openings at desirable locations, so that screws 28 (FIG. 1) may be screwed through the openings. In an embodiment, gold frame 30 is further formed as a part of fixture 24, wherein gold frame 30 may provide a good grounding path for the DUT.

Socket 22 includes metal housing 50, which acts as the frame of socket 22. Metal housing 50 may be formed of copper or a copper alloy, although other metallic materials having good electrical conductivities may also be used. Upper die 52 and lower die 54 are located on the opposite sides of metal housing 50, and may be adhered to metal housing 50. Upper die 52 and lower die 54 may be formed of dielectric plates.

A plurality of pogo pins 34 are placed in metal housing 50, upper die 52, and lower die 54, and are located in the through-holes in metal housing 50, upper die 52, and lower die 54. Each of pogo pins 34 may also extend out of opposite surfaces of metal housing 50, upper die 52, and lower die 54. Upper die 52 and lower die 54 may help limit pogo pins 34, so that pogo pins 34 do not shift in the horizontal direction. Length L1 of the portions (which portions extend out of lower die 54) of pogo pins 34 may be equal to each other. Pogo pins 34 are arranged according to the solder balls, metal bumps, or the contact pads of the DUT with a one-to-one correspondence. For example, pogo pins 34 may be arranged as an array including a plurality of rows and columns (FIG. 4) or any other patterns.

Depending on the structure of the DUT, pogo pins 34 may include signal pins 34A and ground pins 34B. Ground pins 34B are electrically connected to, and may be in physical contact with metal housing 50, which is electrically grounded. The grounding of metal housing 50 and ground pins 34B may be achieved through various mechanisms. For example, metal housing 50 may be connected to ground bars 56 (FIG. 4), which are located in membrane 40 and electrically connected to metal mesh 46. Alternatively, metal housing 50 may be connected to metal mesh 46 through ground pins 34B and the corresponding metal pads 48 and optional vias 47 (FIG. 2B) in membrane 40. Metal mesh 46 may also be electrically connected to a ground pin in PCB 26.

Referring to FIGS. 1 and 2B, signal pins 34A are electrically insulated from ground housing 50. In an embodiment, air-gaps 58 encircle signal pins 34A, and electrically insulate signal pins 34A from metal housing 50. In alternative embodiments, dielectric materials may be filled into gaps 58 as the insulator. In an embodiment, as shown in FIG. 4, signal pins 34A may have a circular bottom view. Accordingly, air-gaps 58 may also have a circular bottom view, with a uniform radius R in all directions. Each of pogo pins 34 and the surrounding metal housing 50 form a co-axial structure. Radius R of air-gaps 58 is selected so that the impedance of the co-axial structures has a desirable value, which may be between about 50 ohms and about 75 ohms, for example.

FIGS. 2A and 2B illustrate magnified cross-sectional views of membrane 40 and socket 22 (FIG. 2B). Membrane 40 includes metal lines 44 embedded in dielectric layers 42. Metal lines 44 may be in a middle level of membrane 40, with dielectric material 42 overlying and underlying metal lines 44. Dielectric material 42 may be formed of a polymer or other flexible dielectric materials. Metal mesh 46 may be attached to the side of membrane 40 close to fixture 24 (refer to FIG. 1). In an embodiment, Metal mesh 46, fixture 24, and gold frame 30 (FIG. 1) are connected to form a common grounding structure. Metal lines 44, which are electrically connected to pogo pins 34A, are spaced apart from metal mesh 46. As shown in FIGS. 1 and 2B, metal lines 44 may comprise portions having longitudinal directions parallel to the surfaces of metal housing 50, and parallel to upper die 52 and lower die 54. Accordingly, each of metal lines 44 forms a transmission line with the grounded metal mesh 46. Distance D (FIGS. 2A and 2B) between metal lines 44 and metal mesh 46 may be selected so that the first impedance of the transmission lines may be substantially equal to the second impedance of the co-axial structures formed of signal pins 34A and metal housing 50. In an exemplary embodiment, the mismatch between the first and the second impedances is less than about 10 percent, or less than about 5 percent, of either the first or the second impedance. As shown in FIG. 1, metal lines 44 may be electrically connected to contact pads or metal bumps 29 on PCB 26 through vias 60, which have at least portions in membrane 40.

As shown in FIG. 2B, metal lines 44 are connected to metal pads 48, which have at least portions in membrane 40. Metal pads 48 are wider than metal lines 44, so that pogo pins 34 may reliably contact the corresponding metal pads 48. In an embodiment, pogo pins 34 are in mechanical (and electrical) contact with metal pads 48, and are not bonded to metal pads 48. The lengthwise directions of pogo pins 34 are also perpendicular to the major surface of membrane 40. As shown in FIG. 1, since screws 28 of socket 22 are pressed against membrane 40, pogo pins 34 are pressed against metal pads 48 by the force applied on metal housing 50 through screws 28.

FIG. 3 illustrates a bottom view (of FIG. 1) of a portion of membrane 40, wherein two metal lines 44 (including 44A and 44B) and metal mesh 46 are illustrated. Signal line 44A may be a signal line carrying radio frequency (RF) signals, which may have a frequency higher than 500 MHz, for example, wherein the RF signals are transferred to/from the respective DUT. Signal line 44B may be a signal line carrying low frequency signals with frequencies lower than the RF frequencies. In an embodiment, the portion of metal mesh 46 that vertically overlaps signal line 44A is solid, and has no opening therein, while the portion of metal mesh 46 that vertically overlaps signal line 44B has a mesh structure, with openings 45 therein.

FIG. 4 illustrates an exemplary bottom view of metal housing 50, wherein the bottom view is obtained from FIG. 1. Upper die 52 and lower die 54 may be smaller than metal housing 50, although they may have substantially the same size. The corners of metal housing 50 may vertically overlap ground bars 56, and may contact ground bars 56. Metal lines 44 are routed through the gaps between ground bars 56. In an embodiment, ground bars 56 are formed at the same level as metal pads 48, and are connected to metal mesh 46, for example, using vias that are similar to vias 47 shown in FIG. 2B. Screws 28 may be located where metal housing 50 is not covered by upper die 52 and lower die 54. Screws 28 may also act as the grounding path that electrically connects metal housing 50 to fixture 24.

Figure 5:
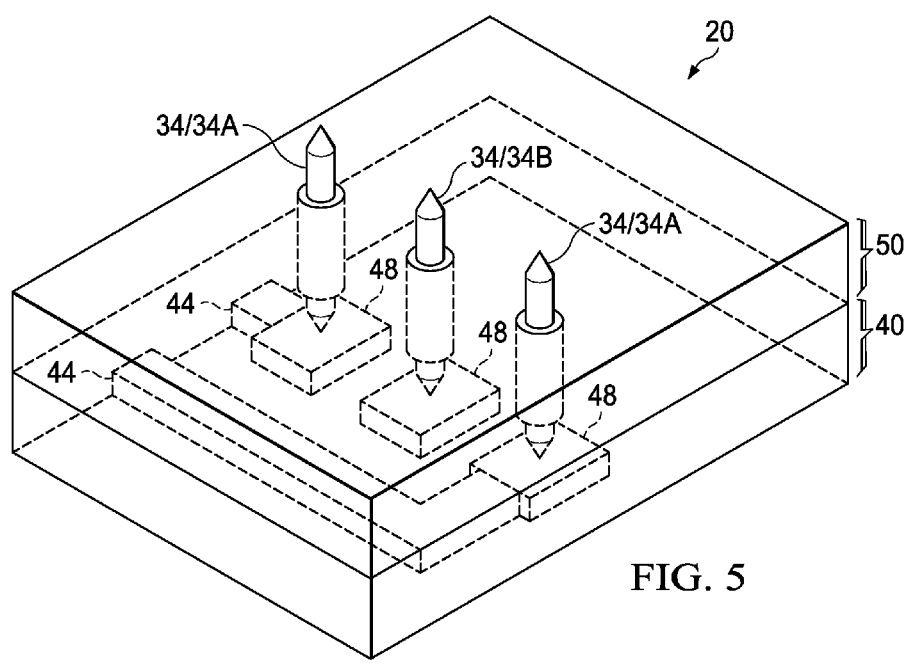
FIG. 5 illustrates a perspective view of a portion of a probe card in accordance with an embodiment.

FIG. 5 illustrates a perspective view of socket 22 and membrane 40, wherein the connections between pogo pins 34A and 34B and metal pads 48 are illustrated. The other parts of probe card 20 are not shown. In the probing of the DUT (not shown), the pin tips of pogo pins 34 are in contact with the DUT. In an embodiment, pogo pins 34 include springs (not shown) therein. When in contact with the DUT, the tips of pogo pins 34 may be pushed back, and the respective pogo pins 34 may become shorter. Therefore, the non-coplanarity in contact pads or solder balls of the DUT may be compensated for, and hence the probe card according to embodiments may tolerate non-coplanarity up to, for example, about 150 μm. The reliability in the testing is thus improved, and it is less likely that good DUTs are mischaracterized as defective DUTs. Furthermore, the tip damage that often occurred to conventional expensive membrane probe cards is avoided, and hence manufacturing cost is lowed.

The probe card in accordance with embodiments, besides the high tolerance to the non-coplanarity in the DUT, is also suitable for testing DUTs having RF devices. Since signal pins 34A (FIG. 1) and metal lines 44 form co-axial structures and transmission lines, respectively, the signal loss of the RF signals that are transmitted through signal pins 34A and metal lines 44 is low. Simulation results have revealed that at 7 GHz, the insertion loss (S12) caused by the probe card in accordance with embodiments is 1 db, and the return loss is 15 db.

In accordance with embodiments, an apparatus includes a metal housing, and a pogo pin penetrating through the metal housing. The pogo pin has a first end extending out of a first surface of the metal housing, and a second end extending out of a second surface of the metal housing, with the first and the second surfaces being opposite surfaces of the metal housing. A membrane is attached to the metal housing, wherein the membrane includes a metal line embedded therein. A metal pad is in physical contact with the pogo pin, wherein at least a portion of the metal pad is inside the membrane.

In accordance with other embodiments, an apparatus includes a fixture, and a membrane attached to the fixture. The membrane includes a metal mesh on a side of the membrane, a plurality of metal lines in membrane and parallel to the metal mesh, and a plurality of metal pads, each connected to one of the plurality of metal lines. A socket is secured onto the fixture, with the membrane located between the fixture and the socket. The socket includes a metal housing having a plurality of through-holes, and a plurality of pogo pins in the through-holes. Each of the plurality of pogo pins is in contact with one of the plurality of metal pads.

In accordance with yet other embodiments, an apparatus includes a metal housing, and a pogo pin penetrating through the metal housing, wherein the pogo pin is electrically insulated from the metal housing. A membrane is attached to the metal housing. The membrane includes a metal mesh on a side of the membrane, wherein the metal mesh is electrically connected to the metal housing. The membrane further includes a metal line embedded in a dielectric material in the membrane, wherein the metal line is parallel to the metal mesh, and wherein the metal line and the metal mesh form a transmission line. A metal pad includes at least a portion in the membrane, wherein the metal pad is connected to the metal line, and wherein the pogo pin is in physical contact with the metal pad.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. An apparatus comprising:
    a metal housing;
    a pogo pin penetrating through the metal housing, wherein the pogo pin comprises a first end extending out of a first surface of the metal housing, and a second end extending out of a second surface of the metal housing, with the first and the second surfaces being opposite surfaces of the metal housing;
    a membrane attached to the metal housing, wherein the membrane comprises a metal line embedded therein; and
    a metal pad in physical contact with the pogo pin, wherein at least a portion of the metal pad is inside the membrane.

2. The apparatus of claim 1, wherein a portion of the membrane comprising the metal pad therein is flexible.

3. The apparatus of claim 2 further comprising:
    a fixture, wherein the metal housing is secured on the fixture, and the membrane comprises a portion located between the fixture and the metal housing; and
    a printed circuit board (PCB), wherein the fixture is attached to the PCB, and wherein a metal feature in the PCB is electrically connected to the pogo pin through the metal line in the membrane.

4. The apparatus of claim 1, wherein the membrane comprises a metal mesh, and wherein the metal mesh and the metal housing are on opposite sides of the metal line.

5. The apparatus of claim 1, wherein the pogo pin is electrically insulated from the metal housing by an air-gap encircling the pogo pin.

6. The apparatus of claim 1, wherein the pogo pin is electrically connected to the metal housing, and wherein the metal housing is electrically connected to an electrical ground through an electrical connection in the membrane.

7. An apparatus comprising:
    a fixture;
    a membrane attached to the fixture, wherein the membrane comprises:
        a metal mesh on a side of the membrane;
        a plurality of metal lines in membrane and parallel to the metal mesh; and
        a plurality of metal pads, each connected to one of the plurality of metal lines; and
    a socket secured onto the fixture, with the membrane located between the fixture and the socket, wherein the socket comprises:
        a metal housing comprising a plurality of through-holes; and
        a plurality of pogo pins in the through-holes, wherein each of the plurality of pogo pins is in contact with one of the plurality of metal pads.

8. The apparatus of claim 7, wherein the plurality of pogo pins comprises a signal pin and a ground pin, wherein the ground pin is in contact with the metal housing, and wherein the signal pin is electrically insulated from the metal housing.

9. The apparatus of claim 8 further comprising an air-gap electrically insulating the signal pin from the metal housing.

10. The apparatus of claim 8, wherein the signal pin and the metal housing form a co-axial structure having a first impedance, wherein one of the plurality of metal lines that is electrically connected to the signal pin forms a transmission line with the metal mesh, and wherein the transmission line has a second impedance substantially equal to the first impedance.

11. The apparatus of claim 7, wherein the plurality of pogo pins comprises a first signal pin and a second signal pin insulated from the metal housing by air-gaps, and wherein a first portion of the metal mesh overlapping the first signal pin is solid with no openings, and wherein a second portion of the metal mesh overlapping the second signal pin has a mesh structure.

12. The apparatus of claim 7 further comprising a printed circuit board (PCB), wherein the fixture is attached to the PCB, and wherein the plurality of the pogo pins is electrically connected to metal features in the PCB through the plurality of metal lines in membrane.

13. The apparatus of claim 7 further comprising a metal bar in the membrane and overlapping a corner portion of the metal housing, wherein the metal bar is electrically connected to the metal housing, and is electrically grounded.

14. The apparatus of claim 7, wherein a portion of the membrane comprising the plurality of metal pads therein is flexible.

15. An apparatus comprising:
    a metal housing;
    a pogo pin penetrating through the metal housing, wherein the pogo pin is electrically insulated from the metal housing;
    a membrane attached to the metal housing, wherein the membrane comprises:

a metal mesh on a side of the membrane, wherein the metal mesh is electrically connected to the metal housing; and a metal line embedded in a dielectric material in the membrane, wherein the metal line is parallel to the metal mesh, and wherein the metal line and the metal mesh form a transmission line; and a metal pad comprising at least a portion in a portion of the membrane, with the portion of the membrane being flexible, wherein the metal pad is connected to the metal line, and wherein the pogo pin is in physical contact with the metal pad.

16. The apparatus of claim 15, wherein the pogo pin is insulated from the metal housing by an air-gap.

17. The apparatus of claim 15, wherein the pogo pin and the metal housing form a co-axial structure with the pogo pin, wherein an electrical insulation between the pogo pin and the metal housing has a circular cross-sectional shape, and wherein the co-axial structure has an impedance substantially equal to an impedance of the transmission line.

18. The apparatus of claim 15, wherein the metal housing and the metal mesh are electrically grounded.

19. The apparatus of claim 15 further comprising an additional pogo pin penetrating through the metal housing, wherein the additional pogo pin is electrically connected to the metal housing.

20. The apparatus of claim 15 further comprising:
a fixture, wherein the membrane, the metal housing, and the pogo pin are secured onto the fixture; and
a printed circuit board (PCB), wherein the metal line in the membrane electrically connects the pogo pin to a metal feature in the PCB.

* * * * *